United States Patent
Ishii et al.

(10) Patent No.: US 8,802,194 B2
(45) Date of Patent: *Aug. 12, 2014

(54) TELLURIUM PRECURSORS FOR FILM DEPOSITION

(75) Inventors: Hana Ishii, Tsukuba (JP); Julien Gatineau, Ibaraki (JP)

(73) Assignee: L'Air Liquide, Société Anonyme pour l'Etude et l'Exploitation des Procédés Georges Claude, Paris (FR)

(*) Notice: Subject to any disclaimer, the term of this patent is extended or adjusted under 35 U.S.C. 154(b) by 452 days.

This patent is subject to a terminal disclaimer.

(21) Appl. No.: 13/168,535

(22) Filed: Jun. 24, 2011

(65) Prior Publication Data

US 2012/0021590 A1    Jan. 26, 2012

Related U.S. Application Data

(63) Continuation-in-part of application No. 12/475,204, filed on May 29, 2009, now Pat. No. 8,101,237.

(60) Provisional application No. 61/057,128, filed on May 29, 2008.

(51) Int. Cl.
  C23C 16/00      (2006.01)
  C23C 16/30      (2006.01)
  C23C 16/455     (2006.01)
  C23C 14/06      (2006.01)

(52) U.S. Cl.
  CPC ......... C23C 16/305 (2013.01); C23C 16/45531 (2013.01); C23C 14/0623 (2013.01); C23C 16/45525 (2013.01)

USPC .. 427/255.29; 427/58; 427/96.8; 427/255.31; 427/255.26

(58) Field of Classification Search
  USPC .................... 427/255.29, 58, 96.8
  See application file for complete search history.

(56) References Cited

U.S. PATENT DOCUMENTS 3,573,958 A    4/1971 Small
4,141,778 A    2/1979 Domrachev et al.
(Continued)

FOREIGN PATENT DOCUMENTS

DE    42 34 998    4/1994
EP    0 568 074    11/1993
(Continued)

OTHER PUBLICATIONS

Ritala et al. Atomic Layer Deposiion of Ge2Sb2T25 thin film. Microelectronic Engineering 86 (2009) 1946-1949. Available online Mar. 10, 2009.*

(Continued)

Primary Examiner — David Turocy
(74) Attorney, Agent, or Firm — Patricia E. McQueeney

(57) ABSTRACT

Methods and compositions for depositing a tellurium-containing film on a substrate are disclosed. A reactor and at least one substrate disposed in the reactor are provided. A tellurium-containing precursor is provided and introduced into the reactor, which is maintained at a temperature ranging from approximately 20° C. to approximately 100° C. Tellurium is deposited on to the substrate through a deposition process to form a thin film on the substrate.

20 Claims, 11 Drawing Sheets

(56) References Cited

U.S. PATENT DOCUMENTS

| | | | |
|---|---|---|---|
| 4,377,613 A | 3/1983 | Gordon | |
| 4,419,386 A | 12/1983 | Gordon | |
| 5,656,338 A | 8/1997 | Gordon | |
| 6,984,591 B1 | 1/2006 | Buchanan et al. | |
| 7,413,776 B2 | 8/2008 | Shenai-Khatkhate et al. | |
| 7,781,340 B2 | 8/2010 | Chen et al. | |
| 8,101,237 B2* | 1/2012 | Okubo et al. | 427/255.29 |
| 2005/0079290 A1 | 4/2005 | Chen et al. | |
| 2006/0046521 A1 | 3/2006 | Vaartstra et al. | |
| 2006/0063394 A1 | 3/2006 | McSwiney et al. | |
| 2006/0138393 A1 | 6/2006 | Seo et al. | |
| 2006/0172067 A1 | 8/2006 | Ovshinsky et al. | |
| 2006/0172068 A1 | 8/2006 | Ovshinsky | |
| 2006/0180811 A1 | 8/2006 | Lee et al. | |
| 2006/0292301 A1 | 12/2006 | Herner | |
| 2007/0054475 A1* | 3/2007 | Lee et al. | 438/483 |
| 2008/0003359 A1 | 1/2008 | Gordon et al. | |
| 2008/0026577 A1 | 1/2008 | Shenai-Khatkhate et al. | |
| 2008/0035906 A1 | 2/2008 | Park et al. | |
| 2008/0096386 A1 | 4/2008 | Park et al. | |
| 2008/0108174 A1 | 5/2008 | Park et al. | |
| 2008/0118636 A1 | 5/2008 | Shin et al. | |
| 2009/0036697 A1 | 2/2009 | Tada et al. | |
| 2009/0137100 A1 | 5/2009 | Xiao et al. | |
| 2009/0142881 A1 | 6/2009 | Xiao et al. | |
| 2009/0162973 A1* | 6/2009 | Gatineau et al. | 438/102 |
| 2009/0280052 A1 | 11/2009 | Xiao et al. | |
| 2009/0299084 A1* | 12/2009 | Okubo et al. | 556/12 |
| 2009/0305458 A1* | 12/2009 | Hunks et al. | 438/102 |
| 2010/0009078 A1* | 1/2010 | Pore et al. | 427/255.28 |
| 2011/0262660 A1 | 10/2011 | Ishii et al. | |

FOREIGN PATENT DOCUMENTS

| | | |
|---|---|---|
| EP | 1 180 553 | 2/2002 |
| EP | 1 464 724 | 10/2004 |
| EP | 1 464 725 | 10/2004 |
| EP | 1 806 427 | 7/2007 |
| EP | 1 995 236 | 11/2008 |
| WO | WO 83 01018 | 3/1983 |
| WO | WO 96 40448 | 12/1996 |
| WO | WO 98 16667 | 4/1998 |
| WO | WO 00 23635 | 4/2000 |
| WO | WO 00 29637 | 5/2000 |
| WO | WO 01 66816 | 9/2001 |
| WO | WO 02 27063 | 4/2002 |
| WO | WO 03 083167 | 10/2003 |
| WO | WO 2007 062096 | 5/2007 |
| WO | WO 2007 067604 | 6/2007 |
| WO | WO 2007 133837 | 11/2007 |
| WO | WO 2007133837 A2 * | 11/2007 |
| WO | WO 2008 002546 | 1/2008 |
| WO | WO 2008 008319 | 1/2008 |
| WO | WO 2008 057616 | 5/2008 |
| WO | WO 2009 039187 | 3/2009 |
| WO | WO 2009 081383 | 7/2009 |
| WO | WO 2009 132207 | 10/2009 |
| WO | WO 2010 055423 | 5/2010 |
| WO | WO 2011 027321 | 3/2011 |

OTHER PUBLICATIONS

Bonasia, P.J. et al. "New reagents for the synthesis of compounds containing metal-tellurium bonds: sterically hindered silyltellurolate derivatives and the x-ray crystal structures of [(THF)2LiTeSi(SiMe3)3]2 and [(12-crown-4)2Li][TeSi(SiMe3)3]", J. Am. Chem. Soc., 1992, 114 (13), pp. 5209-5214.

Breunig, H.J. "Thermochromic molecules with bonds of Se or Te and Sb or Bi", Phosphorus and Sulfur, 1988, vol. 38, pp. 97-102.

Choi B. J. et al. "Cyclic PECVD of $Ge_2Sb_2Te_5$ films using metallorganic sources." J. Electrochem. Soc., 154 (4) H318-H324 (2007).

Choi, et al. "Plasma-enhanced atomic layer deposition of $Ge_2Sb_2Te_5$ films using metal-organic sources for Phase change RAM." ALD 2006 proceedings, p. 62, 2006.

Drake, J.E. et al. "Studies of silyl and germyl group 6 species. 5. Silyl and germyl derivatives of methane- and benzenetellurols," Inorg. Chem. 1980, 19, pp. 1879-1883.

Glatz, F. et al. "Thermal CVD of amorphous germanium films from 2,5-bis(tert.-butyl)-2,5-diaza-1-germa-cyclopentane organometallic precursor." Mat. Res. Soc. Symp. Proc.,1994, vol. 336, pp. 541-545.

Gonzalez-Hernandez, et al. "Structure of oxygen-doped Ge:Sb:Te films." Thin Solid Films (2006), 503(1-2), 13-17.

Groshens, T.J. et al., "Low temperature MOCVD growth of V/VI materials via a $Me_3SiNMe_2$ elimination reaction." Thermoelectrics, 1996. Fifteen International Conference on Pasadena, CA, USA Mar. 26-29, 1996, New York, Mar. 26, 1996, 430-434.

Gu et al. "Optical and structural properties of oxygen-doped and annealed Ge-Sb-Te- thin films." Chinese Journal of Lasers (2003), 30(12), 1110-1115.

Herrmann, W.A. et al. "Stable cyclic germanediyls ("cyclogermylenes"); Synthesis, structure, metal complexes, and thermolyses." Angew. Chem. Int. Ed. Engl., (1992) 31, No. 11, pp. 1485-1488.

Kim, et al. "Phase separation of a $Ge_2Sb_2Te_5$ alloy in the transition from an amorphous structure to crystalline structures." J. Vac. Sci. Technol. 929, 24(4), 2006.

Kim, R-Y et al. "Structural properties of $Ge_2Sb_2Te_5$ thin films by metal organic chemical vapor deposition for phase change memory applications." Applied Physics Letters 89, 102107 (2006).

King, R.B. "Secondary and tertiary phosphine adducts of germanium(II) iodide", Inorganic Chemistry, vol. 2, No. 1, Feb. 1963.

Lappert, M.F. et al. "Monomeric, coloured germanium(II) and tin(II) di-t-butylamides, and the crystal and molecular structure of $Ge(NCMe_2[CH_2]_3CMe_2)_2$". J. Chemical Soc. Chem. Comm. 1980, pp. 621-622.

Lee, J. et al. "GeSbTe deposition for the PRAM application." Applied Surface Science 253 (2007) 3969-3976.

Pore, V. et al. "Atomic layer deposition of metal tellurides and selenides using alkylsilyl compounds of tellurium and selenium," J. Am. Chem. Soc., DOI 10.1021/ja8090388.

Prokop, J. et al. "Selective deposition of amorphous germanium on Si with respect to $SiO_2$ by organometallic CVD." J. NonCryst. Solids, 198-200 (1996) pp. 1026-1028.

Razuvaev, G.A. et al. "Organosilicon and organogermanium derivatives with silicon-metal and germanium-metal bonds," http://media.iupac.org/publications/pac/1969/pdf/1903x0353.pdf.

Shcherbinin, V.V. et al. "Methods for preparing germanium dihalides," Russian J. of General Chem., vol. 68, No. 7, 1998, pp. 1013-1016.

Wang, et al. "Influence of Sn doping upon the phase change characteristics of $Ge_2Sb_2Te_5$." Phys. Stat. Sol. (A) 3087-3095, 201(14), 2004.

International Search Report and Written Opinion for PCT/US2008/076698, Dec. 22, 2008.

International Search Report and Written Opinion for PCT/IB2008/055499, May 15, 2009.

International Search Report and Written Opinion for PCT/IB2009/008067, Jun. 1, 2010.

International Search Report and Written Opinion for PCT/IB2010/053961, Nov. 9, 2010.

Akkari, A. et al., "Three coordinate divalent Group 14 element compounds with a β-diketiminate as supporting ligand $L^2MX$ [$L^2$=PhNC(Me)CHC(Me)NPh, X=Ci, I; M=Ge, Sn]", Journal of Organometallic Chemistry 622 (2001) pp. 190-198.

Ayers, A.E. et al., "Azido derivatives of Germanium(II) and Tin(II): Syntheses and characterization of [$(Mes)^2DAP]GeN^3$, [$(Mes)_2DAP]SnN_3$, and the corresponding chloro analogues featuring heterocyclic six-π-electron ring systems (where [$(Mes)_2DAP$]=N(Mes)C(Me)}$_2$CH)," Inorg. Chem. 2001, 40, pp. 1000-1005.

Becker, G. et al., "Synthese, Struktur und Reaktivität des Lithium-[tris-trimethylsilyl]silyl]tellanids," Anorg. Allg. Chem., 1992, 613, pp. 7-18.

Bonasia, P.J. et al., "Synthesis and characterization of gold(I) thiolates, selenolates, and tellurolates—x-ray crystal structures of

(56) References Cited

OTHER PUBLICATIONS

Au$_4$[TeC(SiMe$_3$)$_3$]$_4$, Au$_{4[SC(SiMe3)3]_4}$, and Ph$_3$PAu[TeC(SiMe$_3$)$_3$]," Inorganic Chemistry, 1993, 32, pp. 5126-5131.

Chizmeshya, A.V.G. et al., "Synthesis of butane-like SiGe hydrides: Enabling precursors for CVD of Ge-rich semiconductors," J. Am. Chem. Soc. 2006, 128, pp. 6919-6930.

Dabbousi, B.O. et al., "(Me$_3$Si)$_3$SiTeH: preparation, characterization, and synthetic utility of a remarkably stable tellurol," J. Am. Chem. Soc., 1991, 113, pp. 3186-3188.

Detty, M.R. et al., "Bis(trialkylsilyl) chalcogenides. 1. Preparation and reduction of group 6A oxides," J. Org. Chem., 1982, 47, pp. 1354-1356.

Ding, Y. et al., "Synthesis and structures of monomeric divalent germanium and tin compounds containing a bulky diketiminato ligand," Organometallics 2001, 20, pp. 1190-1194.

Du Mont, W.W. et al., "Triorganophosphan-dichlor- und -dibroringermandiyl und -stannandiyl: Phosphan-stabilisierte Ge$^{II}$- und Sn$^{II}$-Halogenide," Angew. Chem. 88 Jahr. 1976, Nr. 9, p. 303.

Eom, T. et al., "Atomic Layer Deposition of (GeTe2)x(Sb2Te3)y films for phase change memories," Proceedings of Seoul National University Conference, Feb. 16-18, 2011.

Jutzi, P. et al., "Base stabilized germylene. II. Preparation and properties of benzothiazole dichlorogermylene," Journal of Organometallic Chemistry, 1974, vol. 81, No. 3, pp. 341-350.

Jutzi, P. et al., "On the reactivity of the silicon-carbon bond in pyridylsilanes," Journal of Organometallic Chemistry, 1976, vol. 104, No. 2, p. 153-160.

Jutzi, P. et al., "Stabilization of Monomeric Dichlorogermylene," Angew. Chem. Internat. Edit. vol. 12 (1973), No. 12, pp. 1002-1003.

Kouvetakis, J. et al., "Synthesis and atomic and electronic structure of new Si-Ge-C alloys and compounds," Chem. Matter. 1998, 10, pp. 2935-2949.

Lee, V.Y. et al., "Redox properties of dihalogermylenes, dihalostannylenes and their complexes with Lewis bases," Journal of Organometallic Chemistry, 499 (1995), pp. 27-34.

Mironov, V.B. et al., "New method for preparing germanium dichloride and its use in syntheses of organogermanium compounds," Russian Journal of General Chemistry, vol. 64, No. 8, Part 1, 1994, p. 1180.

Mironov, V.B. et al., "New routes to germanium dihalide dioxanates," Russian Journal of General Chemistry, vol. 64, No. 4, Part 2, 1994, p. 633.

Nagendran, S. et al., "RGe(I)Ge(I)R compound (R=PhC(NtBu)$_2$ with a Ge-Ge single bond and a comparison with the gauche conformation of hydrazine," Organometallics 2008, 27, p. 5459-5463.

Naghavi, N. et al., "Growth studies and characterisation of In2S3 thin films deposited by atomic layer deposition (ALD)," Applied Surface Science 222 (2004), pp. 65-73.

Nefedov, O.M. et al., "Inorganic, organometallic, and organic analogues of carbenes," Angew. Chem. Internat. Edit., vol. 5 (1966), No. 12, pp. 1021-1038.

N-Methyl Morpholine product specification, downloaded from http://chemicalland21.com/industrialchem/functional%20Monomer/N-METHYL%20MORPHOLINE.htm Sep. 1, 2010.

Pacl, Z. et al., "Organogermainum compounds. X. The effect of structure on the basicity of ethyl(dimethylamino)germanes," Collection Czechoslov, Chem. Commun. vol. 36, 1971, pp. 2181-2188.

Ritala, M. et al., "Atomic layer deposition of Ge2Sb2Te$_5$ thin films," Microelectronic Engineering, Oct. 2009, vol. 86, No. 7-9, pp. 1946-1949.

Riviere, P. et al., "Germanium(II) and germanium(IV) compounds form elemental germanium," Organometallics 1991, 10, pp. 1227-1228.

Woelk, E. et al., "Designing novel organogermanium OMVPE precursors for high[purity germanium films," Journal of Crystal Growth 287 (2006), pp. 684-687.

International Search Report and Written Opinion for related PCT/IB2009/008067, Jun. 1, 2010.

International Search Report and Written Opinion for related PCT/IB2010/056118, May 24, 2011.

Austrian Written Opinion for related SG 201008444-0, Jul. 1, 2011.

* cited by examiner

FIG 12a
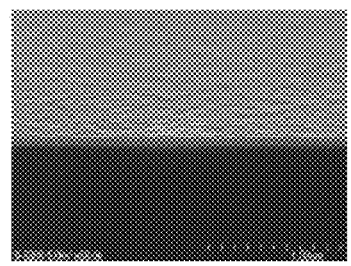
→ Anneal →
FIG 13a
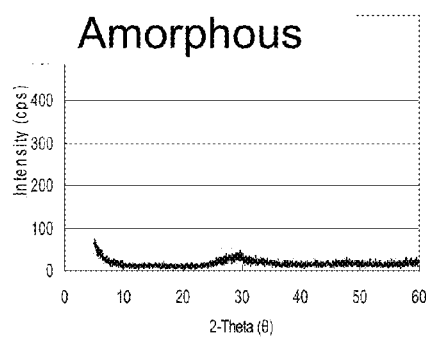
FIG 12b
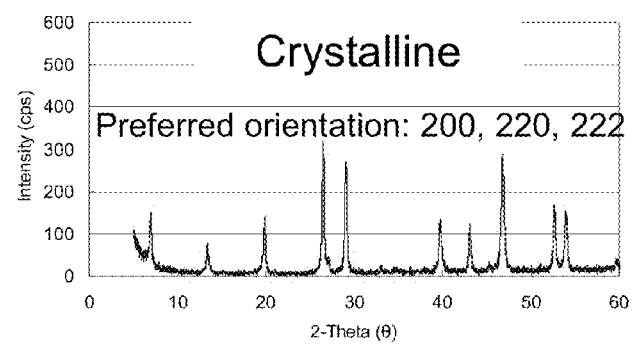
FIG 13b

TELLURIUM PRECURSORS FOR FILM DEPOSITION

CROSS REFERENCE TO RELATED APPLICATIONS

The present application is a continuation-in-part of prior application Ser. No. 12/475,204, filed May 29, 2009 which matured to grant as U.S. Pat. No. 8,101,237 on Jan. 24, 2012, and which claims the benefit of provisional application No. 61/057,128, filed May 29, 2008, both of which are incorporated herein by reference in their entireties for all purposes.

BACKGROUND

Phase change materials are used in standard bulk silicon technologies to form the memory elements of nonvolatile memory devices. Phase change materials exhibit at least two different states, one being amorphous and the other(s) crystalline. The amorphous state is characterized by the absence of crystallinity or the lack of long range order, as opposed to crystallized states, which are characterized by a long range order. Accordingly, the order in a unit cell, which is repeated a large number of times, is representative of the whole material.

Each memory cell in a nonvolatile memory device may be considered as a variable resistor that reversibly changes between higher and lower resistivity states corresponding to the amorphous state and the crystalline state of the phase change material. The states can be identified because each state can be characterized by a conductivity difference of several orders of magnitude. In these devices, the phase changes of the memory element are performed by direct heating of the phase change material with high programming currents. Conventionally, bipolar transistors are used to deliver high programming currents by directly heating the phase change material. The high current produces direct heating of the phase change material, which can cause the phase change material to degrade over repeated programming operations, thereby reducing memory device performance.

Among the materials of practical use today, most contain germanium. Of those materials, the most extensively studied material is $Ge_2Sb_2Te_5$. While the deposition can be conventionally performed by physical vapor deposition (PVD), deposition of chalcogenide films use techniques such as chemical vapor deposition (CVD), atomic layer deposition (ALD), and related techniques including pulse-CVD, remote plasma CVD, plasma assisted CVD, and plasma enhanced ALD is scarce. A variety of precursors are now being studied in order to overcome the challenges of deposition in complex structures, including those consisting of trenches. The use of $Ge(tBu)_4$, $Sb(iPr)_3$ and $Te(iPr)_2$ has been reported, for instance. The use of such molecules for the deposition of germanium-antimony-tellurium (GST) material raises some difficulties, however. For example, low reactivity and/or incompatibilities of the decomposition or reaction temperatures of the different chalcogenide molecules make it difficult to combine them for deposition at low and even mid-range temperatures (300° C.). Although there have been significant advancements in the art, there is continuing interest in the design and use of precursor compounds with improved stability and/or improved reactivity.

Groshens et al. disclose the deposition of $M_2Te_3$ films (with M=Sb or Bi) using $M(NMe_2)_3$ (with M=Sb or Bi) and $(Me_3Si)_2Te$ at temperatures between 25° C. and 150° C. in a low pressure MOCVD reactor (15$^{th}$ International Conference on Thermoelectrics 1996 pp: 430-434).

Okubo et al. disclose methods and compositions for depositing a tellurium-containing film on a substrate at a temperature of at least 100° C. (US2009/0299084).

A need remains for additional tellurium-containing precursors which are sufficiently volatile and/or reactive, yet stable during deposition.

SUMMARY

Disclosed are methods and compositions for the deposition of tellurium-containing films, or germanium antimony telluride ("GST") films on a substrate. The disclosed methods provide a reactor, and at least one substrate disposed in the reactor, to deposit a tellurium or GST film on the substrate(s). A tellurium-containing precursor is introduced into the reactor. The reactor is maintained at a temperature ranging from approximately 20° C. to approximately 100° C. At least part of the tellurium-containing precursor is deposited onto the substrate to form the tellurium-containing film by a vapor deposition method. The tellurium-containing precursor has one of the following general formulas:

  (I)

  (IIa)

  (IIb)

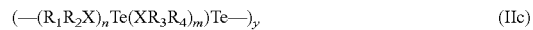  (IIc)

  (III)

  (IV)

wherein:
  $X$, $X_1$, $X_2$ are independently selected from silicon or germanium, provided $X_1$ and $X_2$ are not simultaneously silicon;
  each $R_{1-6}$ is independently selected from H, C1-C6 alkyl, C1-C6 alkoxy, C1-C6 alkylsilyl, C1-C6 perfluorocarbon, C1-C6 alkylsiloxy, C1-C6 alkylamino, alkylsilylamino, and aminoamido groups;
  n and m are integers selected from 0, 1, and 2, with $m+n \neq 0$;
  p is an integer selected from 1 or 2;
  in formulas (IIa) and (IIb), y is an integer selected from 2, 3, and 4; and
  in formula (IIc), y is an integer selected from 1, 2, and 3;
The disclosed methods may also include one or more of the following aspects:
  the tellurium-containing precursor being selected from the group consisting of $(Me_3Ge)_2Te$, $(Et_3Ge)_2Te$, $(iPr_3Ge)_2Te$, $(tBu_3Ge)_2Te$, $(Me_2tBuGe)_2Te$, $((Me_3Si)_3Ge)_2Te$, $(Me_3Ge)Te(Si(SiMe_3)_3)$, and $((Me_3Si)_3Ge)_2Te$;
  the tellurium-containing precursor being $(Me_3Ge)_2Te$;
  introducing at least on reducing gas into the reactor, wherein the reducing gas is selected from the group consisting of: $H_2$, $NH_3$, $SiH_4$, $Si_2H_6$, $Si_3H_8$, plasma excited radicals thereof, and mixtures thereof;
  introducing a second precursor and depositing at least part of the second precursor onto the substrate, the second precursor comprising an element selected from Group 13 to 16 of the Periodic Table, wherein the tellurium-containing film further comprises the element;
  the element being selected from the group consisting of Ge, Sb, Se, S, O, As, P, N, Sn, Si, In, Ga, Al, and B;
  the second precursor being selected from the group consisting of $SbCl_3$, $SbCl_6$, $Sb(OMe)_3$, $Sb(OEt)_3$, $Sb(NMe_2)_3$, $Sb(NEt_2)_3$, $Sb(NMeEt)_3$, $(Me_3Si)_3Sb$, and $(Et_3Si)_3Sb$;

the second precursor being selected from the group consisting of GeCl$_2$-dioxane, GeCl$_2$-adducts, Ge(OMe$_2$)$_4$, Ge(OEt)$_4$, Ge(NMe$_2$)$_4$, Ge(NEt$_2$)$_4$, and Ge(NMeEt)$_4$;

the vapor deposition method being atomic layer deposition or chemical vapor deposition;

introducing a third precursor and depositing at least part of the third precursor onto the substrate, the third precursor comprising an element selected from Group 13 to 16 of the Period Table, wherein the tellurium-containing film further comprises the element of the second precursor and the element of the third precursor;

the element of the third precursor being selected from the group consisting of Ge, Sb, Se, S, O, As, P, N, Sn, Si, In, Ga, Al, and B;

the third precursor being selected from the group consisting of SbCl$_3$, SbCl$_6$, Sb(OMe)$_3$, Sb(OEt)$_3$, Sb(NMe$_2$)$_3$, Sb(NEt$_2$)$_3$, Sb(NMeEt)$_3$, (Me$_3$Si)$_3$Sb, and (Et$_3$Si)$_3$Sb;

the third precursor being selected from the group consisting of GeCl$_2$-dioxane, GeCl$_2$-adducts, Ge(OMe$_2$)$_4$, Ge(OEt)$_4$, Ge(NMe$_2$)$_4$, Ge(NEt$_2$)$_4$, and Ge(NMeEt)$_4$;

the vapor deposition method being atomic layer deposition (ALD) and one of the second precursor or the third precursor being a Ge-containing precursor, the method further comprising increasing a Ge content in the tellurium-containing film by introducing a second pulse of the Ge-containing precursor during one ALD cycle;

maintaining the reactor at a pressure between about 1 Pa and about 10$^5$ Pa;

maintaining the reactor at a pressure between about 25 Pa and about 10$^3$ Pa; and the GST film comprising between approximately 45 atomic % and approximately 55 atomic % Te, between approximately 15 atomic % and approximately 20 atomic % Sb, and between approximately 10 atomic % and approximately 20 atomic % Ge.

Also disclosed are methods of forming a GST film on a substrate. Sequential pulses of a Sb-containing precursor, a Ge-containing precursor, and a Te-containing precursor are introduced into an ALD reactor containing a substrate. Each ALD cycle comprises one pulse of the Sb-containing precursor and the Ge-containing precursor and at least two pulses of the Te-containing precursor. The Te-containing precursor has one of the following general formulae:

$$(X_1R_1R_2R_3)Te(X_2R_4R_5R_6) \quad (I)$$

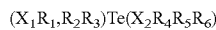 (IIa)

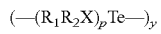 (IIb)

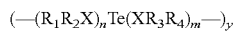 (IIc)

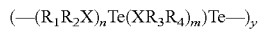 (III)

 (IV)

wherein:

X, X$_1$, X$_2$ are independently selected from silicon or germanium; provided X$_1$ and X$_2$ are not simultaneously silicon;

each R$_{1-6}$ is independently selected from H, C1-C6 alkyl, C1-C6 alkoxy, C1-C6 alkylsilyl, C1-C6 perfluorocarbon, C1-C6 alkylsiloxy, C1-C6 alkylamino, alkylsilylamino, and aminoamido groups;

n and m are integers selected from 0, 1, and 2, with m+n≠0;

p is an integer selected from 1 or 2;

in formulas (IIa) and (IIb), y is an integer selected from 2, 3, and 4; and in formula (IIc), y is an integer selected from 1, 2, and 3;

The disclosed methods may also include one or more of the following aspects:

the Te-containing precursor being selected from the group consisting of (Me$_3$Ge)$_2$Te, (Et$_3$Ge)$_2$Te, (iPr$_3$Ge)$_2$Te, (tBu$_3$Ge)$_2$Te, (Me$_2$tBuGe)$_2$Te, ((Me$_3$Si)$_3$Ge)$_2$Te, (Me$_3$Ge)Te(Si(SiMe$_3$)$_3$), and ((Me$_3$Si)$_3$Ge)$_2$Te;

the tellurium-containing precursor being (Me$_3$Ge)$_2$Te;

the Sb-containing precursor being selected from the group consisting of SbC3, SbCl5, Sb(OMe)3, Sb(OEt)3, Sb(NMe2)3, Sb(NEt2)3, Sb(NMeEt)3, (Me3Si)3Sb, and (Et3Si)3Sb;

the Ge-containing precursor being selected from the group consisting of GeCl2-dioxane, GeCl2-adducts, Ge(OMe2)4, Ge(OEt)4, Ge(NMe2)4, Ge(NEt2)4, and Ge(NMeEt)4;

the GST film comprising between approximately 45 atomic % and approximately 55 atomic % Te, between approximately 15 atomic % and approximately 20 atomic % Sb, and between approximately 10 atomic and approximately 20 atomic % Ge;

the ALD cycle further comprising a second pulse of the Ge-containing precursor;

maintaining the reactor at a pressure between about 1 Pa and about 10$^5$ Pa;

maintaining the reactor at a pressure between about 25 Pa and about 10$^3$ Pa;

maintaining the reactor at a temperature between about 100° C. and about 500° C.;

maintaining the reactor at a temperature between about 150° C. and about 350° C.; and maintaining the reactor at a temperature between approximately 20° C. to approximately 100° C.

Notation and Nomenclature

Certain abbreviations, symbols, and terms are used throughout the following description and claims and include:

As used herein, the term "alkyl group" refers to saturated functional groups containing exclusively carbon and hydrogen atoms. Further, the term "alkyl group" may refer to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation, "Me," refers to a methyl group; the abbreviation, "Et," refers to an ethyl group; the abbreviation, "tBu," refers to a tertiary butyl group; the abbreviation "iPr" refers to an isopropyl group.

As used herein, the abbreviation "ALD" refers to atomic layer deposition; the abbreviation "CVD" refers to chemical vapor deposition, the abbreviation "TGA" refers to thermogravimetric analysis; the abbreviation "EDX" refers to energy dispersive X-ray spectroscopy; the abbreviation "SEM" refers to scanning electron microscopy; and the abbreviation "XRD" refers to X-ray diffraction.

As used herein, the term "independently" when used in the context of describing R groups should be understood to denote that the subject R group is not only independently selected relative to other R groups bearing different subscripts or superscripts, but is also independently selected relative to any additional species of that same R group. For example in the formula MR$^1{}_x$(NR$^2$R$^3$)$_{(4-x)}$, where x is 2 or 3, the two or three R$^1$ groups may, but need not be identical to each other or to R$^2$ or to R$^3$. Further, it should be understood that unless specifically stated otherwise, values of R groups are independent of each other when used in different formulas.

The standard abbreviations of the elements from the periodic table of elements are used herein. It should be understood that elements may be referred to by these abbreviations (e.g., Te refers to tellurium, Ge refers to germanium, etc.).

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein:

FIG. 12a is a SEM picture of an amorphous GST film deposited at room temperature by CVD before annealing;

FIG. 12b is X Ray Diffraction data for the GST film of FIG. 12a, showing the amorphous state of the film.

FIG. 13a is a SEM picture of the GST film of FIG. 12a after annealing at 350° C. resulting in formation a crystalline GST film;

FIG. 13b is X Ray Diffraction data for the GST film of FIG. 13a, showing the crystalline state of the film;

DESCRIPTION OF PREFERRED EMBODIMENTS

Figure 1:
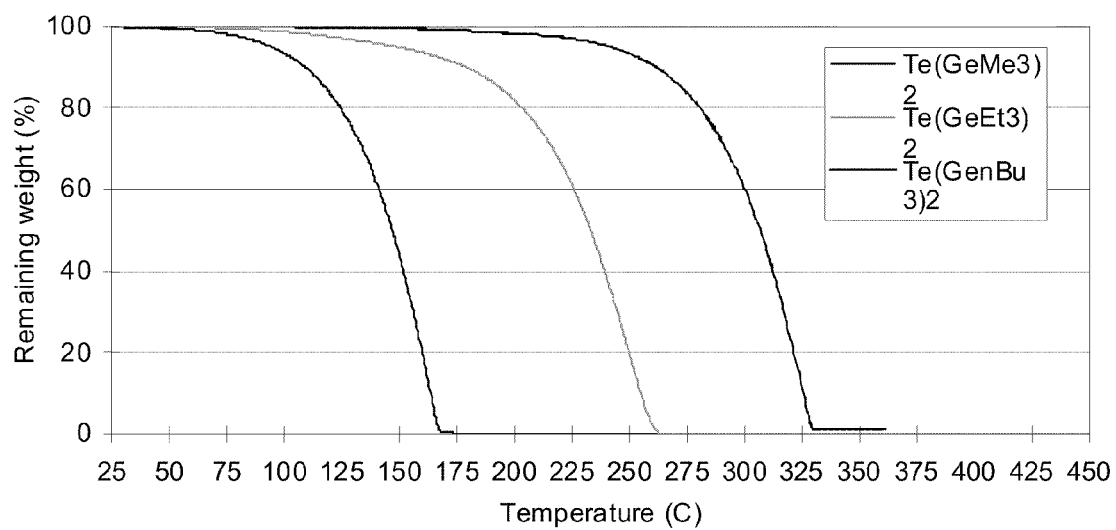
FIG. 1 is a graph of the thermo-gravimetric analysis of several tellurium precursors.

Disclosed are methods of forming tellurium-containing films on a substrate. A tellurium-containing precursor is introduced into a reactor with at least one substrate disposed therein. The tellurium-containing precursor has one of the following general formulae:

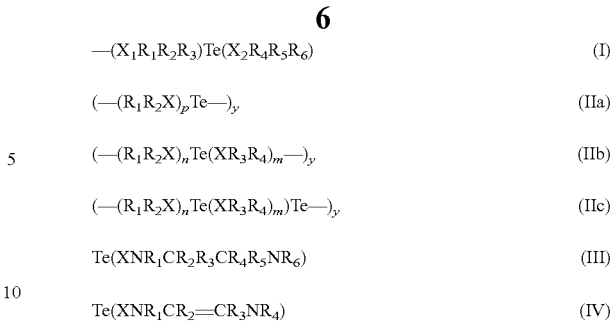

wherein:
X, $X_1$, $X_2$ are independently selected from silicon or germanium, provided $X_1$ and $X_2$ are not simultaneously silicon;
each $R_{1-6}$ is independently selected from H, C1-C6 alkyl, C1-C6 alkoxy, C1-C6 alkylsilyl, C1-C6 perfluorocarbon, C1-C6 alkylsiloxy, C1-C6 alkylamino, alkylsilylamino, and aminoamido groups;
n and m are integers selected from 0, 1, and 2, with m+n≠0;
p is an integer selected from 1 or 2;
in formulas (IIa) and (IIb), y is an integer selected from 2, 3 and 4; and
in formula (IIc), y is an integer selected from 1, 2 and 3.

The reactor is maintained at a temperature ranging from approximately 20° C. to approximately 100° C. At least part of the tellurium-containing precursor is deposited onto the substrate to form a tellurium-containing film by a vapor deposition method.

Applicants have surprisingly discovered that the disclosed molecules may be used to deposit tellurium-containing films at temperatures ranging from approximately 20° C. to approximately 100° C. Depositions at these lower temperatures are advantageous because the lower temperatures cause less damage to the substrate. Furthermore, the low temperature process utilizes a lower thermal budget and provides for higher throughput. Finally, the resulting films are usually amorphous below 100° C. and polycrystalline above 100° C. This difference in phase generates important changes in the film properties (e.g., resistivity, optical properties, film uniformity, process continuity, etc.).

Also disclosed are methods of forming a GST film on a substrate. A Sb-containing precursor, a Ge-containing precursor, and a Te-containing precursor are introduced in sequential pulses into an ALD reactor containing one or more substrates. Each ALD cycle comprises one pulse of the Sb-containing precursor and the Ge-containing precursor and at least two pulses of the Te-containing precursor. The Te-containing precursor may have one of general formulae (I), (IIa), (IIb), (IIc), (III) or (IV) above.

The tellurium-containing precursors of general formula (I) are linear and may be shown schematically as:

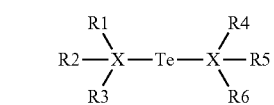

Examples of tellurium-containing precursors covered by general formula (I) include, but are not limited to: $(Me_3Ge)_2Te$, $(Et_3Ge)_2Te$, $(iPr_3Ge)_2Te$, $(tBu_3Ge)_2Te$; $(Me_2tBuGe)_2Te$, $((Me_3Si)_3Ge)_2Te$, $(Me_3Ge)Te(Si(SiMe_3)_3)$, and $((Me_3Si)_3Ge)_2Te$, $((MeO)_3Ge)_2Te$, $((EtO)_3Ge)_2Te$, $((PrO)_3Ge)_2Te$, $((BuO)_3Ge)_2Te$, $((MeO)_3Ge)Te(Si(OMe)_3)$, $((MeO)_3Ge)Te(GeMe_3)$, $((Me_3Si)_3Ge)Te(SiMe_3)$, $((Me_3Si)_3Ge)Te(GeMe_3)$, $((CF_3)_3Ge)_2Te$, $((C_2F_5)_3Ge)_2Te$, ((C₃F₇)₃Ge)₂Te, ((CF₃)₃Ge)Te(GeMe₃), ((Me₃SiO)₃Ge)₂Te, ((Et₃SiO)₃Ge)₂Te, ((Me₃SiO)₃Ge)Te(Si(OSiMe)₃), ((Me₃SiO)₃Ge)Te(SiMe₃), ((Me₂N)₃Ge)₂Te, ((Et₂N)₃Ge)₂Te, ((Pr₂N)₃Ge)₂Te, ((MeEtN)₃Ge)₂Te, ((Me₃SiO)₃Ge)Te(Si(OSiMe)₃), ((Me₃SiO)₃Ge)Te(SiMe₃), . . . (((Me₃Si)₂N)₃Ge)₂Te, (((Et₃Si)₂N)₃Ge)₂Te, (((Me₃Si)₂N)₃Ge)Te(GeMe₃), (((Me₃Si)₂N)₃Ge)Te(SiMe₃), (((Me₂)NCH₂CH₂NCH₃)₃Ge)₂Te, (((Et₂)NCH₂CH₂NCH₃)₃Ge)₂Te, (((MeEt)NCH₂CH₂NCH₃)₃Ge)₂Te. In one alternative, the precursor is selected from the group consisting of (Me₃Ge)₂Te, (Et₃Ge)₂Te, (iPr₃Ge)₂Te, (tBu₃Ge)₂Te, (Me₂tBuGe)₂Te, ((Me₃Si)₃Ge)₂Te, (Me₃Ge)Te(Si(SiMe₃)₃), and ((Me₃Si)₃Ge)₂Te. In another alternative, the precursor is selected from the group consisting of (Me₃Ge)₂Te, (Et₃Ge)₂Te, (iPr₃Ge)₂Te, (tBu₃Ge)₂Te, (Me₂tBuGe)₂Te, and ((Me₃Si)₃Ge)₂Te. In yet another alternative, the precursor is preferably (Me₃Ge)₂Te for deposition of GeTe and GST films because the resulting film will have no Si impurities.

The tellurium-containing precursors of general formula (IIa) are cyclic and, in the case where y=3 and n=1, may be shown schematically as:

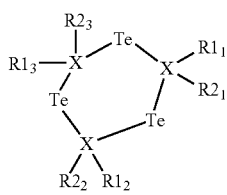

The tellurium-containing precursors of general formula (IIb) are cyclic and, in the case where y=2, n=1, and m=2, may be shown schematically as:

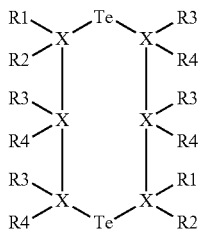

The tellurium-containing precursors of general formula (IIc) are cyclic and, in the case where y=1, n=2, and m=1, may be shown schematically as:

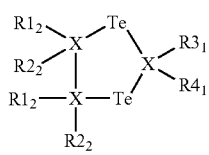

Examples of precursors covered by general formulas (IIa), (IIb) and (IIc) include, but are not limited to: ((GeMe₂)Te—)₃; ((GeEt₂)Te—)₃; ((GeMeEt)Te—)₃; ((GeiPr₂)Te—)₄; ((SiMe₂)Te—)₃; ((SiEt₂)Te—)₃; ((SiMeEt)Te—)₃; ((SiiPr₂)Te—)₄; ((GeMe₂)₂Te(GeMe₂)₂Te—); ((GeMe₂)₃Te—)₂; ((SiMe₂)₃Te—)₂; CH₂CH₂GeMe₂TeGeMe₂-; and SiMe₂SiMe₂GeMe₂TeGeMe₂-.

The tellurium-containing precursor of general formula (III) may be shown schematically as:

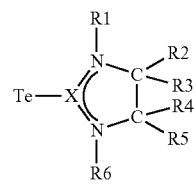

The tellurium-containing precursor of general formula (IV) may be shown schematically as:

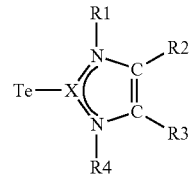

Examples of precursors covered by general formulas (III) and (IV) include, but are not limited to: Te(GeNtBuCH₂CH₂NtBu); Te(GeNtBuCH=CHNtBu); Te((GeNtBuCH(CH₃)CH(CH₃)NtBu); Te(SiNtBuCH₂CH₂NtBu); Te(SiNtBuCH=CHNtBu); and Te((SiNtBuCH(CH₃)CH(CH₃)NtBu).

The disclosed tellurium-containing precursors may be synthesized in various ways. Examples of synthesis of the tellurium-containing precursor include, but are not limited to synthesis schemes 1-5 as shown below:

Scheme 1

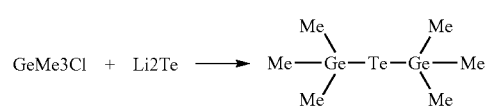

Scheme 2

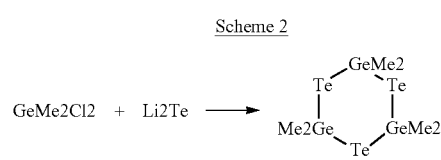

Scheme 3

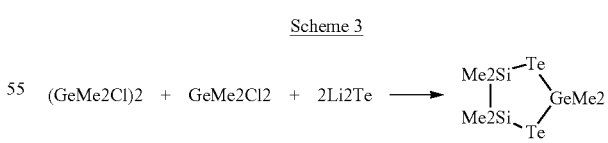

Scheme 4

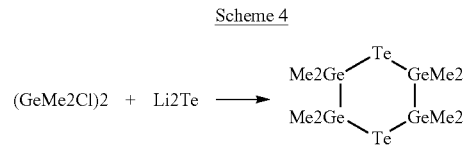

Scheme 5

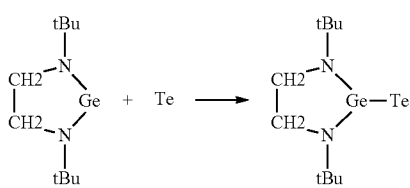

At least part of the disclosed precursors may be deposited to form a thin film using any deposition methods known to those of skill in the art. Examples of suitable deposition methods include without limitation, conventional CVD, atomic layer deposition (ALD), and pulsed chemical vapor deposition (P-CVD). In one alternative, a thermal CVD deposition is preferred, particularly when fast growth, conformality, process-orientation and one direction films are required. In another alternative, a thermal ALD deposition process is preferred, particularly when superior conformality of films deposited on challenging surfaces (e.g., trenchs, holes, vias) is required.

The tellurium-containing precursor is introduced into a reactor in vapor form. The vapor form of the precursor may be produced by vaporizing a liquid precursor solution, through a conventional vaporization step such as direct vaporization, distillation, or by bubbling an inert gas (e.g. $N_2$, He, Ar, etc.) into the precursor solution and providing the inert gas plus precursor mixture as a precursor vapor solution to the reactor. Bubbling with an inert gas may also remove any dissolved oxygen present in the precursor solution.

If necessary, the container may be heated to a temperature that permits the tellurium-containing precursor to be in its liquid phase and to have a sufficient vapor pressure. The container may be maintained at temperatures in the range of, for example, 0° C. to 150° C. Those skilled in the art recognize that the temperature of the container may be adjusted in a known manner to control the amount of tellurium-containing precursor vaporized.

The reactor contains one or more substrates onto which the thin films will be deposited. The one or more substrates may be any suitable substrate used in semiconductor, photovoltaic, flat panel, or LCD-TFT device manufacturing. Examples of suitable substrates include without limitation, silicon substrates, silica substrates, silicon nitride substrates, silicon oxy nitride substrates, titanium nitride substrates, tungsten substrates, or combinations thereof. The silicon substrates may optionally be cleaned with a HF rinse prior to deposition. Additionally, substrates comprising tungsten or noble metals (e.g. platinum, palladium, rhodium, or gold) may be used. Substrates may contain one or more additional layers of materials, which may be present from a previous manufacturing step. Dielectric and conductive layers are examples of these.

The temperature and the pressure within the reactor and the temperature of the substrate are held at conditions suitable for vapor deposition of at least part of the tellurium-containing precursor onto the substrate. The reactor or deposition chamber may be a heated vessel which has at least one or more substrates disposed within. The reactor has an outlet, which may be connected to a vacuum pump to allow by products to be removed from the chamber, or to allow the pressure within the reactor to be modified or regulated. The temperature in the chamber is normally maintained at a suitable temperature for the type of deposition process which is to be performed. In some cases, the chamber may be maintained at a lower temperature, for instance when the substrates themselves are heated directly, or where another energy source (e.g. plasma or radio frequency source) is provided to aid in the deposition. Examples of reactors include, without limitation, a cold-wall type reactor, a hot-wall type reactor, a single-wafer reactor, a multi-wafer reactor, or other types of deposition systems under conditions suitable to cause the precursors to react and form the layers. Any of these reactors may be used for both ALD and CVD processes and therefore qualify as an ALD reactor or a CVD reactor.

In one alternative, the deposition chamber is maintained at a temperature greater than about 100° C. For example, the temperature is maintained between about 100° C. and about 500° C., preferably, between about 150° C. and about 350° C. In another alternative, the deposition chamber may be maintained at a temperature ranging from approximately 20° C. to approximately 100° C. The pressure in the deposition chamber is maintained at a pressure between about 1 Pa and about $10^5$ Pa, and preferably between about 25 Pa, and about $10^3$ Pa.

Depending on the particular process parameters, deposition may take place for a varying length of time. Generally, deposition may be allowed to continue as long as desired to produce a film with the necessary properties. Typical film thicknesses may vary from a few angstroms to several hundreds of microns, depending on the specific deposition process.

In some embodiments, a reducing gas is also introduced into the reaction chamber. The reducing gas may be one of hydrogen, ammonia, silane, disilane, trisilane, the plasma excited radicals thereof, and mixtures thereof. Exemplary plasma excited radicals include hydrogen radicals. The plasma excited radicals may be generated by a plasma located within the reactor, the wafer being between two electrodes, or remote from the reactor. When the mode of deposition is chemical vapor deposition, the tellurium-containing precursor and the reducing gas may be introduced to the reaction chamber substantially simultaneously. When the mode of deposition is atomic layer deposition, the tellurium-containing precursor and the reducing gas may be introduced sequentially, and in some cases, there may be an inert gas purge introduced between the precursor and reducing gas.

A second and third precursor may also be introduced into the reaction chamber and deposited on the substrate. The second and third precursor may serve as a component of the film to be deposited or as a doping agent (i.e., a small amount). The second and third precursor each may independently combrise an element selected from Group 13 to 16 of the Periodic Table of Elements, including, but not limited to, Ge, Sb, Se, S, O, As, P, N, Sn, Si, In, Ga, Al, and B. Alternatively, the second and third precursors may independently be limited to an element selected from Ge, Sb, Se, S, O, As, P, N, Sn, Si, In, Ga, Al, and B. In one alternative, the element of the second precursor is Sb. In another alternative, the element of the second precursor is Ge. In another alternative, both Sb-containing and Ge-containing precursors are utilized. Exemplary antimony-containing precursors may be selected from, but not limited to, $SbCl_3$, $SbCl_5$, $Sb(OMe)_3$, $Sb(OEt)_3$, $Sb(NMe_2)_3$, $Sb(NEt_2)_3$, $Sb(NMeEt)_3$, $(Me_3Si)_3Sb$, and $(Et_3Si)_3Sb$. Exemplary germanium-containing precursors may be selected from, but not limited to, $GeCl_2$-dioxane, $GeCl_2$-adducts, $Ge(OMe_2)_4$, $Ge(OEt)_4$, $Ge(NMe_2)_4$, $Ge(NEt_2)_4$, and $Ge(NMeEt)_4$.

By providing germanium-, tellurium-, and antimony-containing precursors, a chalcogenide glass type film may be formed on the substrate, for instance, $GeTe$—$Sb_2Te_3$ or $Ge_2Sb_2Te_5$. In one alternative, the resulting GST film comprises between approximately 45 atomic % and approximately 55 atomic % Te, between approximately 15 atomic % and approximately 20 atomic % Sb, and between approximately 10 atomic % and approximately 20 atomic % Ge.

The tellurium-containing precursor and any optional reactants or precursors may be introduced sequentially (as in ALD) or simultaneously (as in CVD) into the reaction chamber. The reaction chamber may be purged with an inert gas between the introduction of the precursor and the introduction of the reactant. Alternatively, the reactant and the precursor may be mixed together to form a reactant/precursor mixture, and then introduced to the reactor in mixture form. In another alternative, either the tellurium-containing precursor or any optional reactants or precursors may be introduced into the reaction chamber, while a second component (either the tellurium-containing precursor or any optional reactants or precursors) is pulsed into the reaction chamber (pulsed CVD).

The tellurium-containing precursor vapor solution and the reaction gas may be pulsed sequentially or simultaneously (e.g. pulsed CVD) into the reactor. Each pulse of precursor may last for a time period ranging from about 0.01 seconds to about 10 seconds, alternatively from about 0.3 seconds to about 3 seconds, alternatively from about 0.5 seconds to about 2 seconds. In another embodiment, the reaction gas may also be pulsed into the reactor. In such embodiments, the pulse of each gas may last for a time period ranging from about 0.01 seconds to about 10 seconds, alternatively from about 0.3 seconds to about 3 seconds, alternatively from about 0.5 seconds to about 2 seconds.

In one non-limiting exemplary atomic layer deposition type process, the vapor phase of a tellurium-containing precursor is introduced into the reaction chamber, where it is contacted with a suitable substrate. Excess tellurium-containing precursor may then be removed from the reaction chamber by purging and/or evacuating the reaction chamber. An oxygen source, such as oxygen, ozone, plasma excited radicals thereof, or combinations thereof, is introduced into the reaction chamber where it reacts with the absorbed tellurium-containing precursor in a self-limiting manner. Any excess oxygen source is removed from the reaction chamber by purging and/or evacuating the reaction chamber. If the desired film is a tellurium oxide film, this two-step process may provide the desired film thickness or may be repeated until a film having the necessary thickness has been obtained.

Alternatively, if the desired film contains two elements, the vapor phase of a tellurium-containing precursor may be introduced into the reaction chamber, where it is contacted with a suitable substrate. Excess tellurium-containing precursor may then be removed from the reaction chamber by purging and/or evacuating the reaction chamber. The vapor phase of a second precursor, such as a Ge-containing precursor or a Sb-containing precursor, is introduced into the reaction chamber where it reacts with the absorbed tellurium-containing precursor in a self-limiting manner. Any excess second precursor is removed from the reaction chamber by purging and/or evacuating the reaction chamber. This two-step process may provide the desired film thickness or may be repeated until a film having the necessary thickness has been obtained.

In another alternative, when the desired film is a GST film, the vapor phase of an antimony-containing precursor may be introduced into the reaction chamber, where it is contacted with a suitable substrate. Excess antimony-containing precursor may then be removed from the reaction chamber by purging and/or evacuating the reaction chamber. The vapor phase of a tellurium-containing precursor is introduced into the reaction chamber where it reacts with the absorbed antimony-containing precursor in a self-limiting manner. Any excess tellurium-containing precursor is removed from the reaction chamber by purging and/or evacuating the reaction chamber. The vapor phase of a Ge-containing precursor is introduced into the reaction chamber where it reacts with the adsorbed antimony-containing precursor and tellurium-containing precursor in a self-limiting manner. Any excess germanium-containing precursor is removed from the reaction chamber by purging and/or evacuating the reaction chamber. The vapor phase of the tellurium-containing precursor is introduced into the reaction chamber again, where it reacts with the adsorbed precursors in a self-limiting manner. Any excess tellurium-containing precursor is removed from the reaction chamber by purging and/or evacuating the reaction chamber. This four-step process may provide the desired GST film thickness or may be repeated until a film having the necessary thickness has been obtained.

By varying the number of pulses, films having a desired stoichiometric ratio may be obtained. For example, if the GST film above contains less than the desired amount of germanium, the exemplary process described above may be altered to include an additional introduction (e.g., a second pulse) of the Ge-containing precursor. One of ordinary skill in the art will recognize that the number of pulses required to obtain the desired film may not be identical to the stoichiometric ratio of the resulting film.

The tellurium-containing films resulting from the processes discussed above may include TeN, TeO, GeTe—$Sb_2Te_3$, $Ge_2Sb_2Te_5$, $Sb_2Te_3$, or GeTe. One of ordinary skill in the art will recognize that by judicial selection of the appropriate tellurium-containing precursor, reactants, and precursors, the desired film composition may be obtained.

EXAMPLES

The following non-limiting examples are provided to further illustrate embodiments of the invention. However, the examples are not intended to be all inclusive and are not intended to limit the scope of the inventions described herein.

Example 1

Thermal characterization of tellurium precursors was performed.

All of the thermo-gravimetric analyses (TGA) were performed in an inert atmosphere in order to avoid reaction of the molecules with air and moisture (same atmosphere encountered in the deposition process). The experiments were performed at atmospheric pressure.

The results of the thermo-gravimetric analyses of $Te(GeMe_3)_2$, $Te(GeEt_3)_2$, and $Te(GenBu_3)_2$ are shown in FIG. 1. It was observed that these molecules could be volatized without leaving significant residues. This proves that decomposition of the molecule did not occur under these conditions, while some of the molecules were heated at relatively high temperature (>325° C.). The volatility of the molecules can also be assessed from these TGAs. $Te(GeMe_3)_2$ seems to be the most volatile precursor, as it was fully evaporated at 170° C. $Te(GeEt_3)_2$ is ranked second in terms of volatility, with a full evaporation at around 265° C. The volatility and evaporation patterns of all these molecules fit to the criteria of CVD/ALD molecules.

Example 2

Figure 2:
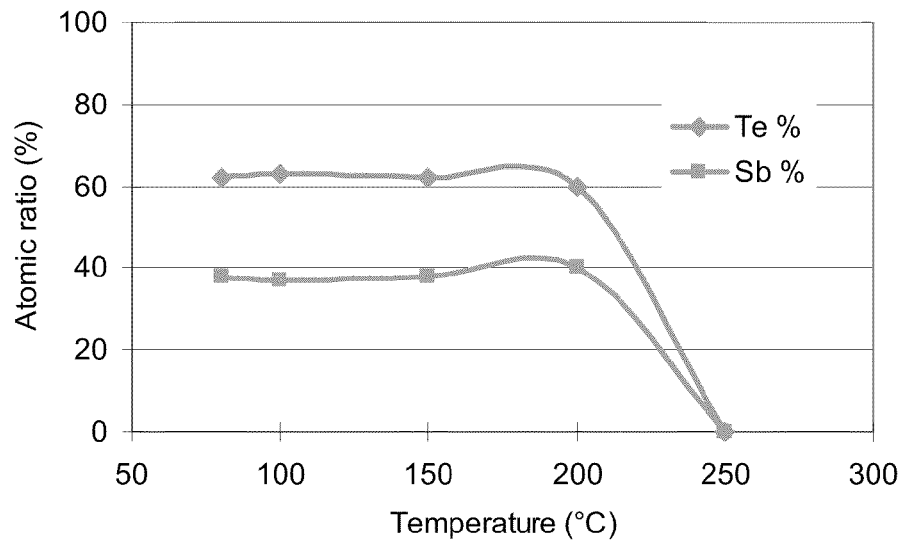
FIG. 2 is an EDX graph showing that the percent atomic ratio of Sb:Te is approximately 40:60 in $Sb_2Te_3$ films deposited by CVD at temperatures from 80° C. to 200° C.
Figure 3:
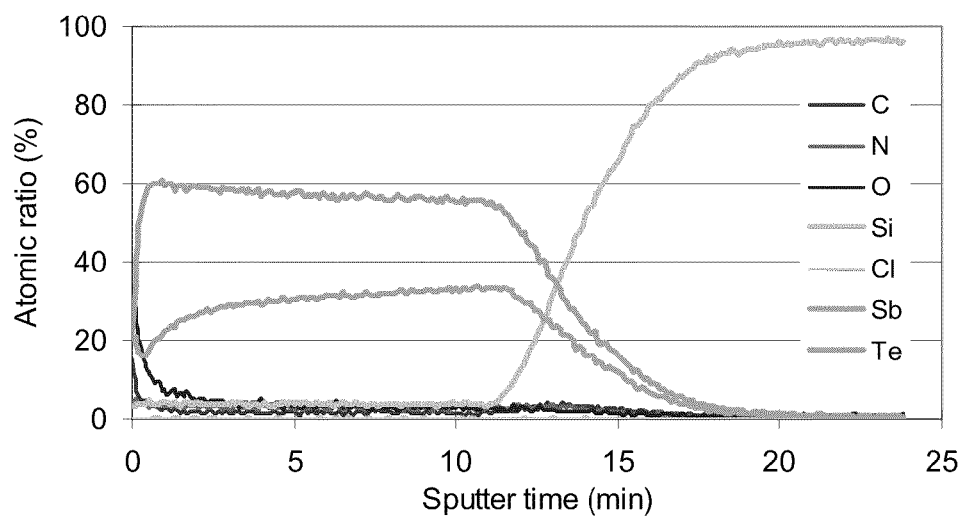
FIG. 3 is an Auger spectroscopy graph showing the percent atomic ratio of Sb:Te in films deposited by CVD at 150° C.

$Sb_2Te_3$ films were deposited on Si wafers using $SbCl_3$ (Sb precursor) and $(Me_3Ge)_2Te$ (Te precursor) in CVD conditions. The precursors ratio was Sb:Te=10:1 (Sb rich conditions). The pressure of the CVD reactor was 10 Torr. Depositions were performed at wafer temperatures of 60° C., 80° C., 100° C., 150° C., 200° C., and 250° C. Energy Dispersive X-ray spectroscopy (EDX) measurements indicated that stoichiometric $Sb_2Te_3$ films were obtained from 80° C. to 200° C. with stable composition. FIG. 2 is an EDX graph showing that the percent atomic ratio of Sb:Te is approximately 40:60 in the $Sb_2Te_3$ films deposited at temperatures from 80° C. to 200° C. Auger spectroscopy measurements of films deposited at 150° C. indicated films having approximately 55 atomic % to 60 atomic % Te and approximately 25 atomic % to approximately 35 atomic % Sb. FIG. 3 is an Auger spectroscopy graph showing the percent atomic ratio of Sb:Te in the films deposited at 150° C. X-ray diffraction analysis indicated that the film deposited at 60° C. was crystalline rhombohedral phase $Sb_2Te_3$. Scanning Electron Microscope (SEM) analyses were also performed to observe the structure of the crystals. The grain size increased from ~0.2 μm at 80° C., ~0.4-0.6 μm at 100° C. and 150° C., to ~1-2 μm at 200° C.

Example 3

GeTe films were deposited on Si wafers using $GeCl_2$:dioxane (Ge precursor) and $(Me_3Ge)_2Te$ (Te precursor) in CVD conditions. The precursors ratio was Ge:Te=2:1 (Ge rich conditions). The pressure of the CVD reactor was 10 Torr. Depositions were performed at wafer temperatures of 60° C., 90° C., 150° C., and 200° C. Conflicting atomic ratio data was obtained from EDX and Auger spectroscopy. SEM analysis indicated that polycrystalline films were observed at temperatures as low as 90° C. The grain size increased with increasing deposition temperature. X-ray diffraction analysis indicated that the film deposited at 90° C. was crystalline rhombohedral phase GeTe.

Example 4

The same deposition process as described in Example 3 was performed at 20° C., yielding GeTe films.

Example 5

Figure 4:
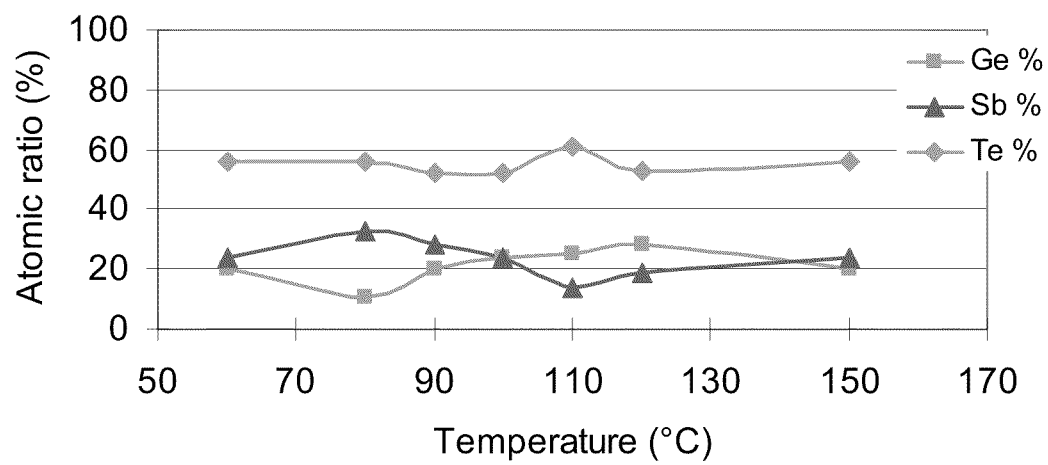
FIG. 4 is an EDX graph showing that the percent atomic ratio of Ge:Sb:Te is approximately 2:2:5 in GST films deposited by CVD at temperatures from 60° C. to 150° C.
Figure 5:
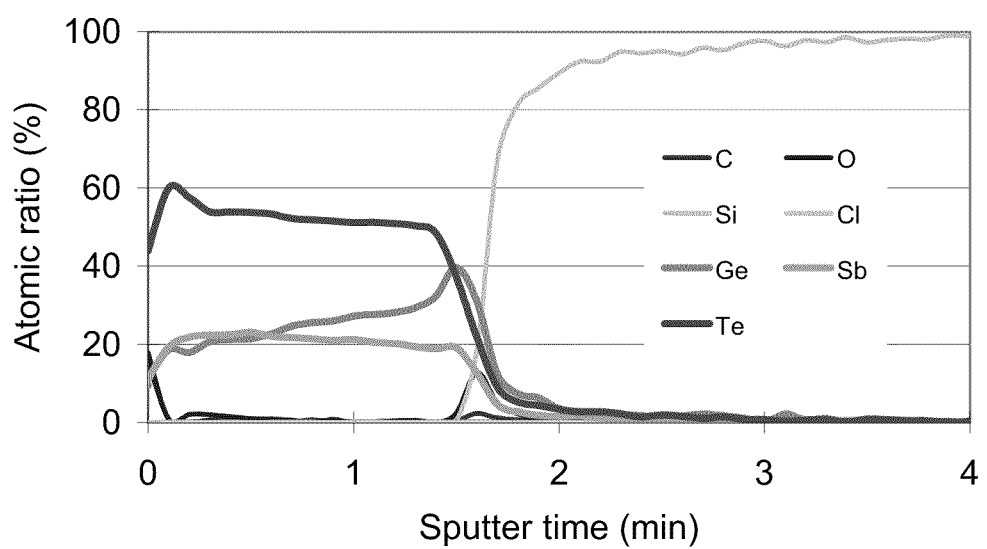
FIG. 5 is an Auger spectroscopy graph showing the percent atomic ratio of Ge:Sb:Te in films deposited by CVD at 90° C.
Figure 6:
FIG. 6 is a SEM picture of a GST film deposited by CVD on Si at 100° C.

GST films were deposited on Si wafers, on Si wafers cleaned with HF, on $SiO_2$ layers on Si wafers, and on TiN layers on Si wafers using $(Me_3Ge)_2Te$ (Te precursor), $SbCl_3$ (Sb precursor), and $GeCl_2$:dioxane (Ge precursor) in CVD conditions. The precursors ratio was Ge:Sb:Te=2.3:10:1. The pressure of the CVD reactor was 10 Torr. Depositions were performed at wafer temperatures of 60° C., 80° C., 90° C., 100° C., 110° C., 120° C., and 150° C. Both EDX and Auger spectroscopy measurements indicated that the Ge:Sb:Te ratio in the deposited film was approximately 2:2:5. FIG. 4 is an EDX graph showing that the percent atomic ratio of Ge:Sb:Te is approximately 2:2:5 in the GST films deposited at temperatures from 60° C. to 150° C. FIG. 5 is an Auger spectroscopy graph showing the percent atomic ratio of Ge:Sb:Te in the films deposited at 90° C. SEM analysis indicated that amorphous films were obtained at 80° C., 90° C., and 100° C. and crystalline films were obtained at 110° C., 120° C., and 150° C. FIG. 6 is a SEM picture of the GST film deposited on Si at 100° C.

Example 6

Figure 7:
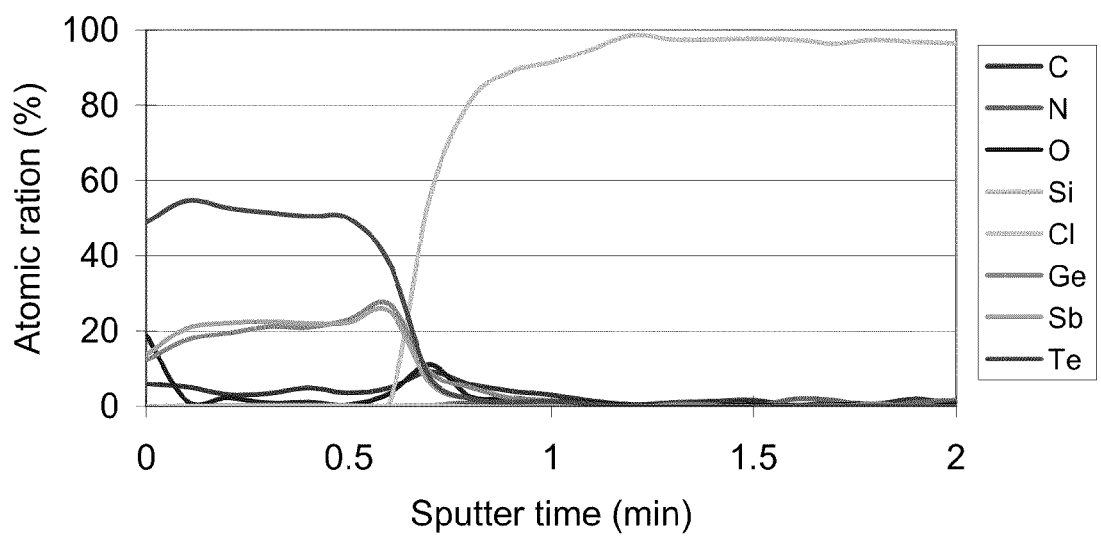
FIG. 7 is an Auger spectroscopy graph showing the percent atomic ratio of Ge:Sb:Te in a film deposited by CVD at room temperature.

GST films were deposited on Si wafers using $(Me_3Ge)_2Te$, $SbCl_3$, and $GeCl_2$:dioxane in CVD conditions. The precursors ratio was Ge:Sb:Te=3.7:5:1. The pressure of the CVD reactor was 10 Torr. The deposition was performed at room temperature (approximately 20° C.). A 53 nm film (determined by SEM) was deposited having a GST ratio of approximately 2:2:5. FIG. 7 is an Auger spectroscopy graph showing the percent atomic ratio of Ge:Sb:Te in the film. An amorphous GST film was formed as determined by XRD (see FIG. 12A of Example 14 for a SEM picture of the amorphous film).

Example 7

GST films were deposited on Si wafers using $(Me_3Ge)_2Te$, $SbCl_3$, and $GeCl_2$:dioxane in CVD conditions. The pressure of the CVD reactor was 10 Torr. Depositions were performed at 90° C. The precursors' ratio was varied. A Ge:Sb:Te precursor ratio of 2:10:1 yielded a Ge:Sb:Te film ratio of 18:24:48, as determined by Auger spectroscopy. A Ge:Sb:Te precursor ratio of 3.7:10:1 yielded a Ge:Sb:Te film ratio of 17:24:48, as determined by Auger spectroscopy. A Ge:Sb:Te precursor ratio of 3.7:5:1 yielded a GST film ratio of 23:22:50, as determined by Auger spectroscopy. SEM analysis results suggest that all three depositions yielded amorphous films. As a result, controlling the precursor flow ratio provides control of the composition of the resulting GST film.

Example 8

Figure 8:
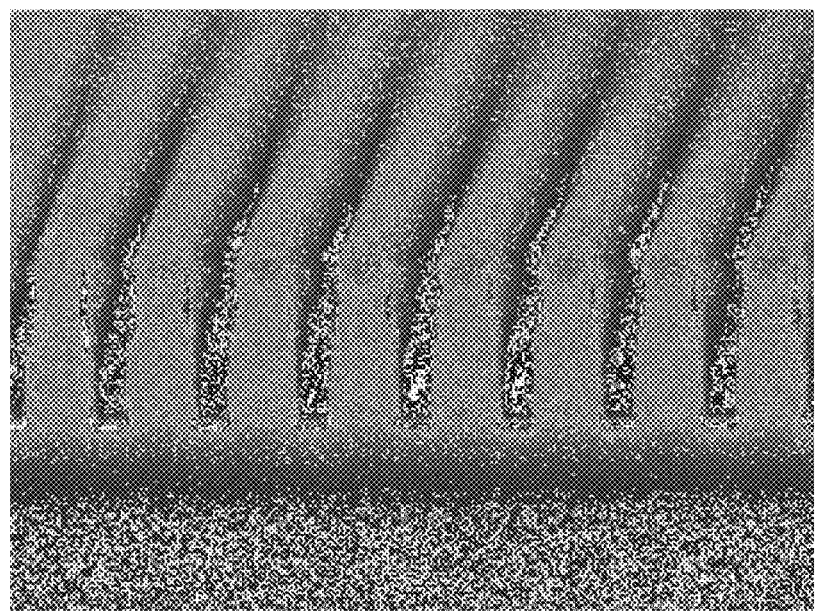
FIG. 8 is a SEM picture of the coverage of a GST film deposited by CVD at room temperature on a $SiO_2$ trench wafer having a 6:1 aspect ratio.

A GST film was deposited on a $SiO_2$ trench wafer using $(Me_3Ge)_2Te$, $SbCl_3$, and $GeCl_2$:dioxane in CVD conditions. The trench had a 6:1 aspect ratio. The pressure of the CVD reactor was 10 Torr. Depositions were performed at room temperature. The GST film obtained had step coverage greater than 85%. FIG. 8 is a SEM picture of the film coverage.

Example 9

Figure 9:
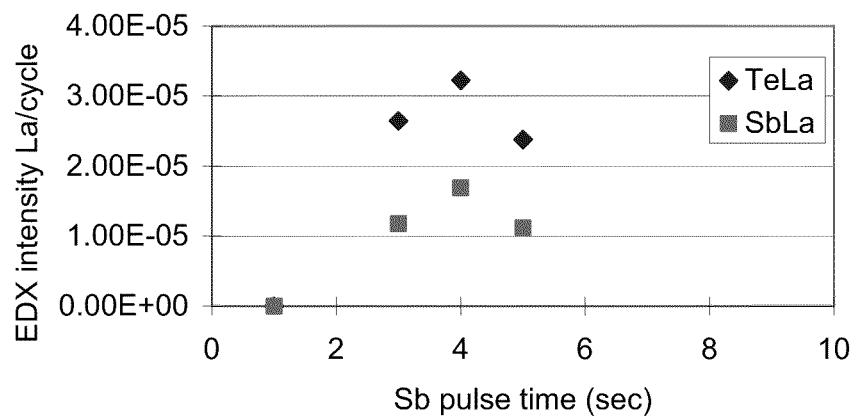
FIG. 9 is a graph of the ALD precursor saturation curve for Sb in a SbTe film.

A SbTe film was deposited on a Si wafer using $SbCl_3$ and $(Me_3Ge)_2Te$ in ALD conditions at 90° C. A pulse of the $SbCl_3$ precursor was followed by a $N_2$ purge. A pulse of the $(Me_3Ge)_2Te$ precursor was followed by a $N_2$ purge. Both saturation behavior and the absence of the parasitic CVD phenomenon were confirmed. FIG. 9 is a graph of the ALD precursor saturation curve for Sb in a SbTe film.

Example 10

Figure 10:
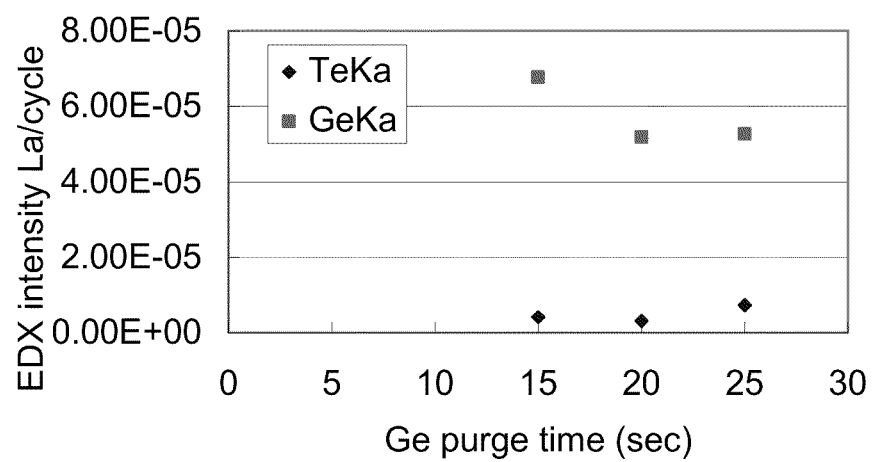
FIG. 10 is a graph of the ALD purge saturation curve for Ge in a GeTe film.

A GeTe film was deposited on a Si wafer using $GeCl_2$:dioxane and $(Me_3Ge)_2Te$ in ALD conditions at 90° C. A pulse of the $GeCl_2$:dioxane precursor was followed by a $N_2$ purge. A pulse of the $(Me_3Ge)_2Te$ precursor was followed by a $N_2$ purge. Both saturation behavior and the absence of the parasitic CVD phenomenon were confirmed. FIG. 10 is a graph of the ALD purge saturation curve for Ge in a GeTe film.

Example 11

Figure 11:
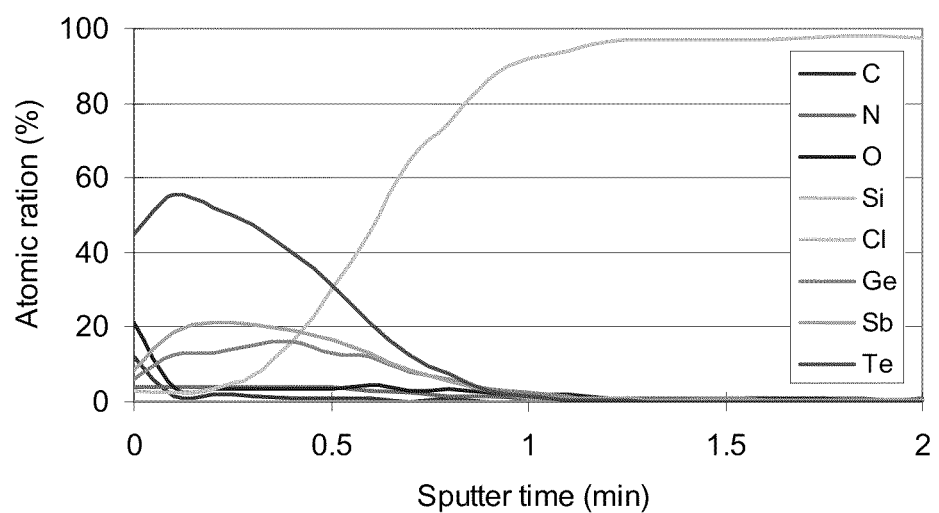
FIG. 11 is an Auger spectroscopy graph showing the percent atomic ratio of Ge:Sb:Te in the film deposited by ALD at 90° C.

GST films were deposited on a Si wafer, on a Si wafer cleaned with HF, on a $SiO_2$ layer on a Si wafer, and on a TiN layer on a Si wafer using $(Me_3Ge)_2Te$, $SbCl_3$, and $GeCl_2$:dioxane in ALD conditions at 20° C., 60° C., and 90° C. The ALD cycle included a pulse of the $SbCl_3$ precursor followed by a $N_2$ purge, a pulse of the $(Me_3Ge)_2Te$ precursor followed by a $N_2$ purge, a pulse of the $GeCl_2$:dioxane precursor followed by a $N_2$ purge, and a pulse of the $(Me_3Ge)_2Te$ precursor followed by a $N_2$ purge. FIG. 11 is an Auger spectroscopy graph showing the percent atomic ratio of Ge:Sb:Te in the film. SEM analysis results indicated that the GST films deposited at 20° C. and 60° C. yielded amorphous films and that the GST films deposited at 90° C. yielded crystalline films. The deposition rate for the films deposited at 20° C. was approximately 0.68 Å/cycle.

Example 12

The GST film deposited at 20° C. in Example 11 was deficient in Ge (containing approximately 8 atomic %). An additional Ge and Te pulse was added to the cycle. The ALD cycle included a pulse of the $SbCl_3$ precursor followed by a $N_2$ purge, a pulse of the $(Me_3Ge)_2Te$ precursor followed by a $N_2$ purge, a pulse of the $GeCl_2$:dioxane precursor followed by a $N_2$ purge, a pulse of the $(Me_3Ge)_2Te$ precursor followed by a $N_2$ purge, a pulse of the $GeCl_2$:dioxane precursor followed by a $N_2$ purge, and a pulse of the $(Me_3Ge)_2Te$ precursor followed by a $N_2$ purge. GST films were deposited on Si, $SiO_2$, and TiN wafers at 20° C. The concentration of germanium in the film increased to approximately 14%. The tuning of the germanium content was also confirmed at other deposition temperatures using the same method.

Applicants believe that the antimony concentration may be tuned in a similar manner (i.e., by addition of an extra Sb and Te pulse to the cycle of Example 10).

Example 13

Amorphous GST films deposited by CVD at room temperature were subject to annealing for 5 minutes at 350° C. under a $N_2$ atmosphere at 10 Torr. SEM analysis of the GST film deposited before annealing is shown in FIG. 12A. SEM analysis of the GST film after annealing is shown in FIG. 13A. As shown in FIGS. 12A and 13A, the amorphous films changed to crystalline films. As shown in FIGS. 12B and 13B, the phase change was confirmed by X-Ray Diffraction. Cubic and hexagonal structures were observed.

Example 14

Figure 14:
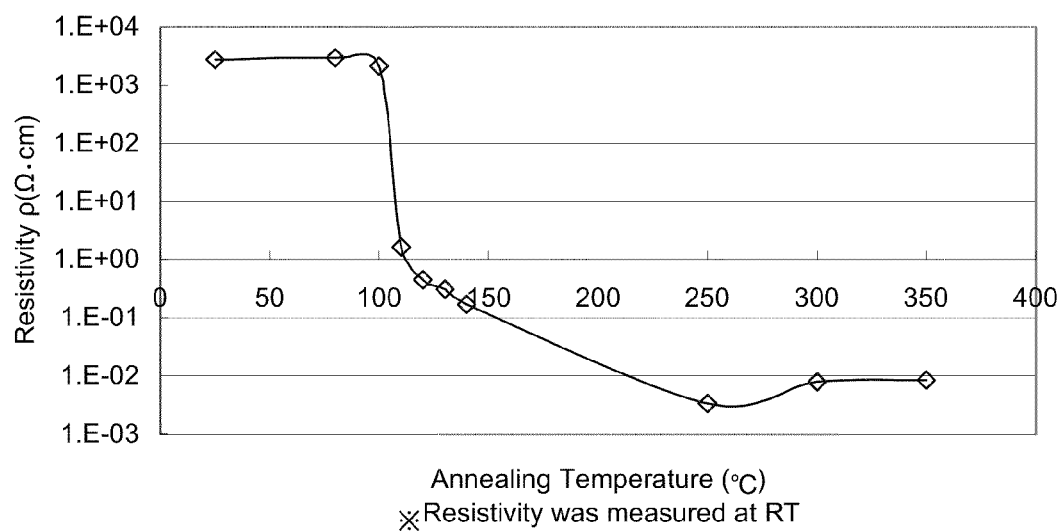
FIG. 14 is a graph showing the resistivity at room temperature of the GST film versus the annealing temperature.

Amorphous GST films were deposited in CVD mode as described in Example 6, but on $SiO_2$ instead of Si. The amorphous GST films were subject to annealing for 5 minutes at different temperatures between 80° C. and 350° C. under a $N_2$ atmosphere at 10 Torr, and cooled down naturally to room temperature. Resistivity analyses of the obtained films are reported in FIG. 14. A drastic decrease of resistivity can be observed between 100° C. and 110° C., indicating a phase change between amorphous and crystalline state.

Example 15

Figure 15:
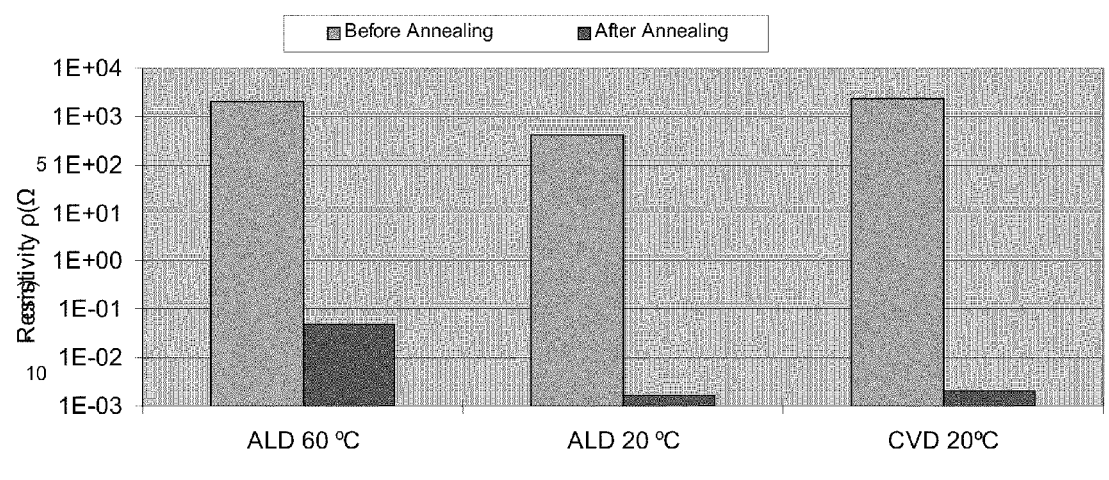
FIG. 15 is a graph showing the resistivity at room temperature of the GST films deposited by ALD at 20° C. and 60° C. and by CVD at 20° C. before and after annealing.

Amorphous GST films from Examples 6 (CVD at room temperature), 11 (ALD at 60° C.), and 12 (ALD at 20° C. with additional Ge and Te pulse) were subject to annealing for 5 minutes at 350° C. under a $N_2$ atmosphere at 10 Torr. As shown in FIG. 15, the three films show a dramatic decrease in resistivity after the anneal process, proving the phase change transition between amorphous and crystalline state for films deposited in CVD and ALD mode.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method of forming a tellurium-containing film on a substrate, comprising:
    a) providing a reactor and at least one substrate disposed therein;
    b) introducing a tellurium-containing precursor into the reactor, wherein the tellurium-containing precursor is selected from the group consisting of $(Me_3Ge)_2Te$, $(Et_3Ge)_2Te$, $(iPr_3Ge)_2Te$, $(tBu_3Ge)_2Te$, $(Me_2tBuGe)_2Te$, $((Me_3Si)_3Ge)_2Te$, $(Me_3Ge)Te(Si(SiMe_3)_3)$, and $((Me_3Si)_3Ge)_2Te$;
    c) Maintaining the reactor at a temperature ranging from approximately 20° C. to approximately 100° C.; and
    d) Depositing at least part of the tellurium-containing precursor onto the substrate to form a tellurium-containing film by a vapor deposition method.

2. The method of claim 1, wherein the tellurium-containing precursor is $(Me_3Ge)_2Te$.

3. The method of claim 1, further comprising introducing at least on reducing gas into the reactor, wherein the reducing gas is selected from the group consisting of: $H_2$, $NH_3$, $SiH_4$, $Si_2H_6$, $Si_3H_8$, plasma excited radicals thereof, and mixtures thereof.

4. The method of claim 1, further comprising introducing a second precursor and depositing at least part of the second precursor onto the substrate, the second precursor comprising an element selected from Group 13 to 16 of the Periodic Table, wherein the tellurium-containing film further comprises the element.

5. The method of claim 4, wherein the element is selected from the group consisting of Ge, Sb, Se, S, O, As, P, N, Sn, Si, In, Ga, Al, and B.

6. The method of claim 5, wherein the second precursor is selected from the group consisting of $SbCl_3$, $SbCl_5$, $Sb(OMe)_3$, $Sb(OEt)_3$, $Sb(NMe_2)_3$, $Sb(NEt_2)_3$, $Sb(NMeEt)_3$, $(Me_3Si)_3Sb$, and $(Et_3Si)_3Sb$.

7. The method of claim 5, wherein the second precursor is selected from the group consisting of $GeCl_2$-dioxane, $GeCl_2$-adducts, $Ge(OMe_2)_4$, $Ge(OEt)_4$, $Ge(NMe_2)_4$, $Ge(NEt_2)_4$, and $Ge(NMeEt)_4$.

8. The method of claim 4, wherein the vapor deposition method is atomic layer deposition or chemical vapor deposition.

9. The method of claim 4, further comprising introducing a third precursor and depositing at least part of the third precursor onto the substrate, the third precursor comprising an element selected from Group 13 to 16 of the Period Table, wherein the tellurium-containing film further comprises the element of the second precursor and the element of the third precursor.

10. The method of claim 9, wherein the element of the third precursor is selected from the group consisting of Ge, Sb, Se, S, O, As, P, N, Sn, Si, In, Ga, Al, and B.

11. The method of claim 9, wherein the vapor deposition method is atomic layer deposition or chemical vapor deposition.

12. The method of claim 11, wherein the vapor deposition method is atomic layer deposition (ALD) and one of the second precursor or the third precursor is a Ge-containing precursor, the method further comprising increasing a Ge content in the tellurium-containing film by introducing a second pulse of the Ge-containing precursor during one ALD cycle.

13. The method of claim 12, where in the Ge-containing precursor is selected from the group consisting GeCl$_2$-dioxane, GeCl$_2$-adducts, Ge(OMe$_2$)$_4$, Ge(OEt)$_4$, Ge(NMe$_2$)$_4$, Ge(NEt$_2$)$_4$, and Ge(NMeEt)$_4$.

14. The method of claim 1, further comprising annealing the tellurium-containing film.

15. A method of forming a GST film on a substrate, the method comprising introducing into an ALD reactor containing a substrate sequential pulses of a Sb-containing precursor, a Ge-containing precursor, and a Te-containing precursor, each ALD cycle comprising one pulse of the Sb-containing precursor and the Ge-containing precursor and at least two pulses of the Te containing precursor, wherein the Te-containing precursor is selected from the group consisting of (Me$_3$Ge)$_2$Te, (Et$_3$Ge)$_2$Te, (iPr$_3$Ge)$_2$Te, (tBu$_3$Ge)$_2$Te, (Me$_2$tBuGe)$_2$Te, ((Me$_3$Si)$_3$Ge)$_2$Te, (Me$_3$Ge)Te(Si(SiMe$_3$)$_3$), and ((Me$_3$Si)$_3$Ge)$_2$Te.

16. The method of claim 15, wherein the Sb-containing precursor is selected from the group consisting of SbCl$_3$, SbCl$_5$, Sb(OMe)$_3$, Sb(OEt)$_3$, Sb(NMe$_2$)$_3$, Sb(NEt$_2$)$_3$, Sb(NMeEt)$_3$, (Me$_3$Si)$_3$Sb, and (Et$_3$Si)$_3$Sb.

17. The method of claim 15, wherein the Ge-containing precursor is selected from the group consisting of GeCl$_2$-dioxane, GeCl$_2$-adducts, Ge(OMe$_2$)$_4$, Ge(OEt)$_4$, Ge(NMe$_2$)$_4$, Ge(NEt$_2$)$_4$, and Ge(NMeEt)$_4$.

18. The method of claim 15, the GST film comprising between approximately 45 atomic % and approximately 55 atomic % Te, between approximately 15 atomic % and approximately 20 atomic % Sb, and between approximately 10 atomic % and approximately 20 atomic % Ge.

19. The method of claim 15, wherein one ALD cycle further comprises a second pulse of the Ge-containing precursor.

20. The method of claim 15, wherein the tellurium-containing precursor is (Me$_3$Ge)$_2$Te.

* * * * *